United States Patent [19]
Harper et al.

[11] Patent Number: 6,150,723
[45] Date of Patent: Nov. 21, 2000

[54] COPPER STUD STRUCTURE WITH REFRACTORY METAL LINER

[75] Inventors: James M. E. Harper, Yorktown Heights, N.Y.; Robert M. Geffken, Burlington, Vt.

[73] Assignee: International Business Machines Corporation, Armonk, N.Y.

[21] Appl. No.: 08/941,857

[22] Filed: Sep. 30, 1997

[51] Int. Cl.[7] .................................................. H01L 23/485
[52] U.S. Cl. .......................... 257/762; 257/751; 257/774
[58] Field of Search ................... 438/622, 623, 438/634, 643, 687; 257/762, 751, 640, 774, 775

[56] References Cited

U.S. PATENT DOCUMENTS

| | | | |
|---|---|---|---|
| 4,691,435 | 9/1987 | Anantha et al. | 437/175 |
| 5,221,449 | 6/1993 | Colgan et al. | 204/192.15 |
| 5,284,801 | 2/1994 | Page et al. | |
| 5,312,773 | 5/1994 | Nagashima | 437/190 |
| 5,316,974 | 5/1994 | Crank | 437/190 |
| 5,529,953 | 6/1996 | Shoda | 437/189 |
| 5,547,901 | 8/1996 | Kim et al. | 437/187 |
| 5,585,673 | 12/1996 | Joshi et al. | 257/751 |
| 5,585,674 | 12/1996 | Geffken et al. | 257/767 |
| 5,824,599 | 10/1998 | Schacham-Diamand et al. | 438/678 |
| 5,904,565 | 5/1999 | Nguyen et al. | 438/687 |
| 5,976,972 | 11/1999 | Inohara et al. | 438/640 |
| 6,037,664 | 3/2000 | Zhao et al. | 257/758 |

FOREIGN PATENT DOCUMENTS

| | | |
|---|---|---|
| 5-206641 | 8/1993 | Japan . |
| 5-218645 | 8/1993 | Japan . |
| 9-51168 | 2/1997 | Japan . |

OTHER PUBLICATIONS

IBM Technical Disclosure Bulletin, vol. 22 No. 11, Apr. 1980, Method of Producing Schottky Contacts, p. 4964.
IBM Technical Disclosure Bulletin, vol. 26 No. 7A, Dec. 1983, "Sealed Contact Hole", p. 3112.
Research Disclosure Kenneth Mason Publication, Ltd. England, No. 275, Mar., 1987, "Dual–Dielectric Fabrication Method", p. A–144.
IBM Technical Disclosure Bulletin, vol. 29 No. 12, May, 1987, "Alternative Method of Making Self–Aligned MESFET Transistors", p. 5266–5268.
IBM Technical Disclosure Bulletin, vol. 30 No. 7, Dec. 1987, "Single Mask and Imaging for a Dual Level Self Aligned Definition", p. 195–196.
IBM Technical Disclosure bulletin, vol. 30 No. 8, Jan., 1988, "Methods of Forming Small Contact Holes", p. 252–253.
IBM Technical Disclosure Bulletin, vol. 30 No. 8, Jan., 1988, "Nitride Sidewall Spacers Used as a Contamination Barrier", p. 295–296.
IBM Technical Disclosure Bulletin, vol. 32 No. 8B, Jan., 1990, "Self–Isolated Tapered Submicron Contact Hole with Variable Double Isolator Thickness", p. 456–458.
IBM Technical Disclosure Bulletin, vol. 32 No. 10B, Mar., 1990, "Lithographic Patterns with a Barrier Liner", p. 114–115.
Research Disclosure Kenneth Mason Publication, Ltd., No. 316, Aug., 1990, "Polymide Vias with Nitride Sidewall Structure for Improved Tungsten Fill", p. A–139.

*Primary Examiner*—Caridad Everhart
*Attorney, Agent, or Firm*—DeLio & Peterson LLC; John J. Tomaszewski; Howard J. Walter, Jr.

[57] ABSTRACT

A multilayer interconnected electronic component having increased electromigration lifetime is provided. The interconnections are in the form of studs and comprise vertical side walls having a refractory metal diffusion barrier liner along the sidewalls. The stud does not have a barrier layer at the base thereof and the base of the stud contacts the metallization on the dielectric layer of the component. An adhesion layer can be provided between the base of the stud and the surface of the metallization and the adhesion layer may be continuous or discontinuous. The adhesion layer is preferably a metal such as aluminum which dissolves in the stud or metallization upon heating of the component during fabrication or otherwise during use of the component. A preferred component utilizes a dual Damascene structure.

20 Claims, 6 Drawing Sheets

US 6,150,723

COPPER STUD STRUCTURE WITH REFRACTORY METAL LINER

BACKGROUND OF THE INVENTION

1. Field of the Invention

This invention relates to electronic components such as semiconductor devices, multilayer ceramic structures and multilayer thin film structures having electrical interconnection structures within the component and, more particularly, to vertical interconnect structures which electrically connect metallization on one layer of the structure to metallization on another layer and which interconnect structures and electronic components have an increased electromigration lifetime.

2. Description of Related Art

Multi-layer electronic components offer an attractive packaging solution for high performance systems such as in computer, telecommunications, military and consumer applications. These electronic components offer high density interconnections and the ability to provide increased circuitry for a given electronic component size.

In general, multilayer electronic components comprise multiple layers of a dielectric material having metallization on each layer in the form of vias, pads, straps connecting pads to vias and wiring. Vias or other openings in the dielectric layer extend from one layer to another layer and these openings are filled with a conductive material and electrically connect the metallization on one layer to the metallization on another layer and provide for the high density electronic component devices now used in industry.

An important aspect of multilayer electronic components is the via or openings between layers in which a conductive material is applied to provide electrical contact between the metallization on different layers. Broadly stated, the typical multilayer electronic component is built up from a number of layers of a dielectric material layer such as silicon oxide, fuorinated silicon oxide, polymers including polyimide and fluorinated polyimide, ceramics, carbon and other dielectric materials. In the processing sequence known in the art as the "Damascene Process", the dielectric layer is patterned using known techniques such as the use of a photoresist material which is exposed to define the wiring pattern. After developing, the photoresist acts as a mask through which a pattern of the dielectric material is removed by a subtractive etch process such as plasma etching or reactive ion etching. Using the Damascene Process, openings defining wiring patterns are provided in the dielectric layer, extending from one surface of the dielectric layer to the other surface of the dielectric layer. These wiring patterns are then filled with a metal using a filling technique such as electroplating, electroless plating, chemical vapor deposition, physical vapor deposition or a combination of methods. This process may include planarization of the metal by removing excess material with a method such as chemical mechanical polishing. In the Single Damascene Process, vias or openings are additionally provided in the dielectric layer and filled with metallization to provide electrical contact between layers of wiring levels. In the Dual Damascene Process, the via openings and the wiring pattern openings are both provided in the dielectric layer before filling with metallization. This process simplifies the procedure and eliminates some internal interfaces. These procedures are continued for each layer in the electronic component until the electronic component is completed.

In FIG. 4, a dual Damascene line of the prior art is shown. Dielectric layers 11a and 11b having horizontal barrier layers 16 thereon are shown comprising metallization 12 on layer 11b and metallization 12a and stud 14 in layer 11a. The stud 14 and metallization 12a are shown encased by a vertical wall of a diffusion barrier liner 15 and a horizontal liner 15a including a liner at the base of the stud which provides a diffusion barrier between the base of stud 14 and the upper surface of metallization 12. It is this type structure which has been shown to contribute to an interconnected electronic component having a low electromigration life.

The dielectric material provides electrical insulation and electrical isolation between the copper wiring elements. The openings in the dielectric layer typically called vias, when filled with a conductive material, are typically referred to as studs. The studs provide the vertical interconnections between the horizontal copper metallization on the various layers of the electronic component.

To avoid metal diffusion between the metal and the dielectric, barrier layers, also referred to as liners, are included in the structure to contain the copper or other metal and to provide improved adhesion of the copper lines and studs to the dielectric or other metallization.

For vias, the barrier layer is typically a refractory metal such as Ta or TaN and presents a barrier to the diffusion of copper metal between the via and the dielectric but also presents a barrier between the copper metal and the metallization of the underlying or overlying conductor wiring levels. Typically, the barrier layer is formed in the via on both sidewalls and at the base thereof to form the barrier layer. When the copper is plated and fills the via, the barrier layer separates the stud from the dielectric and from the lower and upper layer metallization with which the stud makes an electrical connection. It has been found that when the copper wiring in the electronic component is exposed to a high electrical circuit density for a long period of time, that the barrier layer may result in a void developing in the copper stud or metallization (depending on the direction of the current flow) and a failure by electrical open circuit may result. The time needed for this failure to occur is known as the electromigration lifetime and is a function of the stud and metallization materials and the barrier layer material.

A related application was filed on May 19, 1997 by the assignee of the present invention and is entitled "Method Of Forming A Self-Aligned Copper Diffusion Barrier In Vias" and is directed to a copper diffusion barrier formed on the sidewalls of vias.

Bearing in mind the problems and deficiencies of the prior art, it is therefore an object of the present invention to provide a multilayer electronic component including components made using a single Damascene process or a dual Damascene process comprising at least one layer having through openings or vias which are filled with a conductive material to form a stud which stud electrically connects metallization on the layers and which stud and electronic component have an increased electromigration lifetime.

It is another object of the present invention to provide a method for making a multilayer electronic component having stud interconnections including components made using a single Damascene process or a dual Damascene process, wherein the stud and electronic component have an increased electromigration lifetime.

Still other objects and advantages of the invention will in part be obvious and will in part be apparent from the specification.

SUMMARY OF THE INVENTION

The above and other objects, which will be apparent to one skilled in the art, are achieved in the present invention which relates in one aspect to a multilayer electronic component comprising at least one layer of dielectric having metallization on both surfaces of the layer and openings (vias) extending through the layer and connecting the metallization on one surface with the metallization on the other surface, the through openings comprising a diffusion barrier material, preferably a refractory metal such as tantalum, tungsten, tantalum nitride, tungsten nitride, silicon nitride, tungsten silicon nitride, titanium nitride and titanium silicon nitride on the sidewalls of the opening and a conductor within the sidewalls filling the opening with the conductor and contacting the metallization.

In a further aspect of the present invention, the dielectric material of the electronic component is a multilayer oxide, ceramic or polyimide (polymer) and the metallization on the surfaces of the oxide layers, ceramic layers or other dielectric layers are the same metal which is preferably copper. The dielectric of the electronic component may comprise a wide variety of materials and is generally silicon oxide, a fluorinated oxide, a polymer, a diamond-like carbon or a spun on glass.

In an additional aspect of the invention, an adhesion layer is provided between the via metallization and the surface metallization. The adhesion layer does not act as a diffusion barrier to the via metallization, and the adhesion layer is very thin and may be discontinuous. A preferred adhesion layer is aluminum or chromium and it is highly preferred that the adhesion layer dissolve in the via and/or surface metallization during fabrication or use of the electronic component.

In a further aspect of the invention, a horizontal diffusion barrier is provided between the surface of the dielectric and the metallization on the surface of the dielectric as, for example, an etch stop diffusion barrier to the dielectric when etching the vias in a dual Damascene process.

BRIEF DESCRIPTION OF THE DRAWINGS

The features of the invention believed to be novel and he elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which.

DESCRIPTION OF THE PREFERRED EMBODIMENTS

Figure 1:
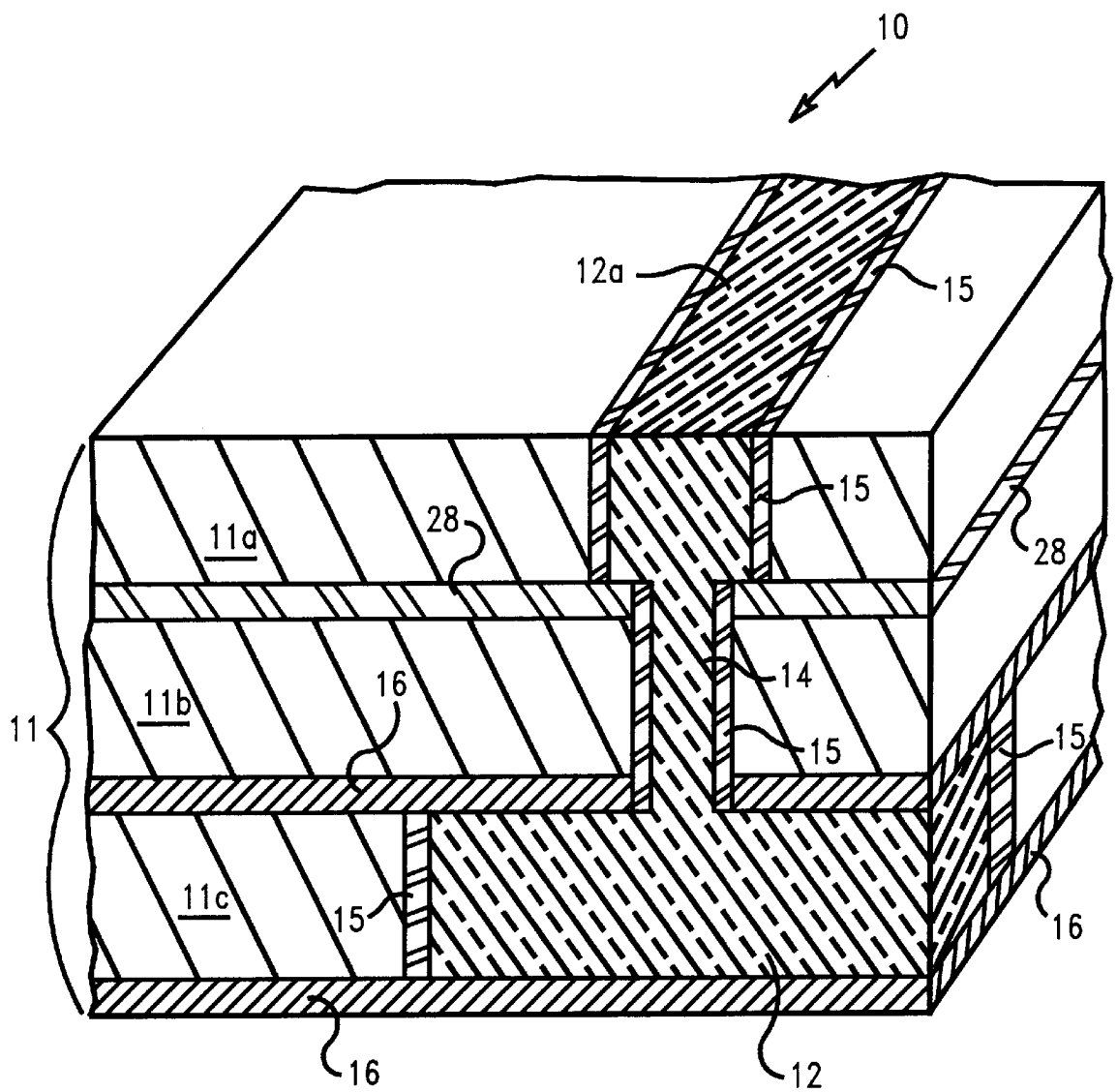
FIG. 1 is a partial cross-sectional perspective view of an electrically interconnected multilayer electronic component of the invention.

In describing the preferred embodiment of the present invention, reference will be made herein to FIGS. 1–4 of the drawings in which like numerals refer to like features of the invention. Features of the invention are not necessarily shown to scale in the drawings.

Referring to FIG. 1, part of a multilayer electronic component 10 is shown schematically in partial cross-section in perspective and comprises layers collectively shown as 11 and individually as 11a, 11b and 11c. The layers 11 may be made of any suitable dielectric material depending on the application for the electronic component, and includes materials such as silicon oxide, fluorinated oxide, a polymer such as polyimide, a diamond-like carbon or a spun on glass. The layers are shown having metallization thereon in the form of wires or lines 12 and 12a and interconnecting via or stud 14. Stud 14 can be seen electrically connecting wire 12a to wire 12. Metallization layers 12, 12a and stud 14 are formed of conductors such as copper.

Layers 11a–11c are shown separated by horizontal barrier layers 16 and 28 which may or may not be the same and which prevent the diffusion of the copper metallization from one layer to the next layer. Layer 28 may be a material which also acts as an etch-step when chemically etching the component. A vertical barrier diffusion layer (liner) 15 is shown forming the outer walls of metallization 12 and 12a and stud 14. Liner 15 is avoided between stud 14 and either metallization 12 or metallization 12a to enhance the electromigration lifetime of all the metal layers and consequently the useful life of the component. The vertical liner 15 may be formed as described below in FIGS. 2A–2E.

The liner 15 may be any suitable material which provides a diffusion barrier between the wire and/or stud metallization and the dielectric. Preferred liner materials are the refractory metals such as tantalum, tungsten, tantalum nitride, tungsten nitride, silicon nitride, tantalum silicon nitride, tungsten silicon nitride, titanium nitride and titanium silicon nitride, preferably tantalum containing materials. The thickness of the liner is usually 2 nm to 100 nm.

Figure 2A:
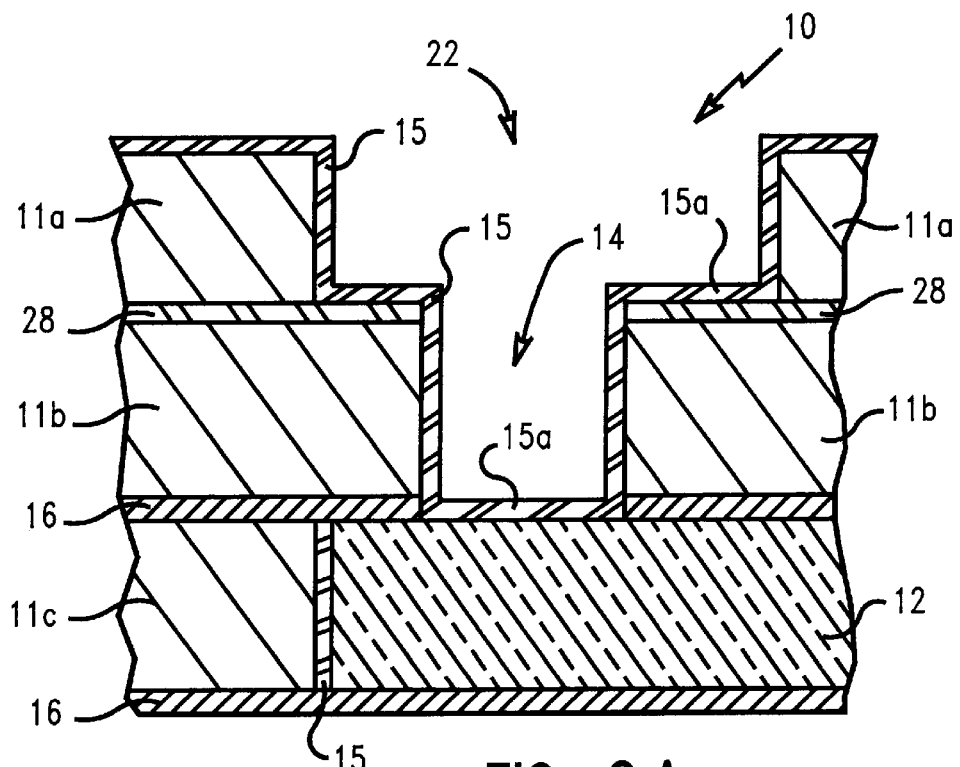
FIGS. 2A–2E show a sequence of steps for forming a dual Damascene line and interconnection stud according to the method of the invention.
Figure 2B:
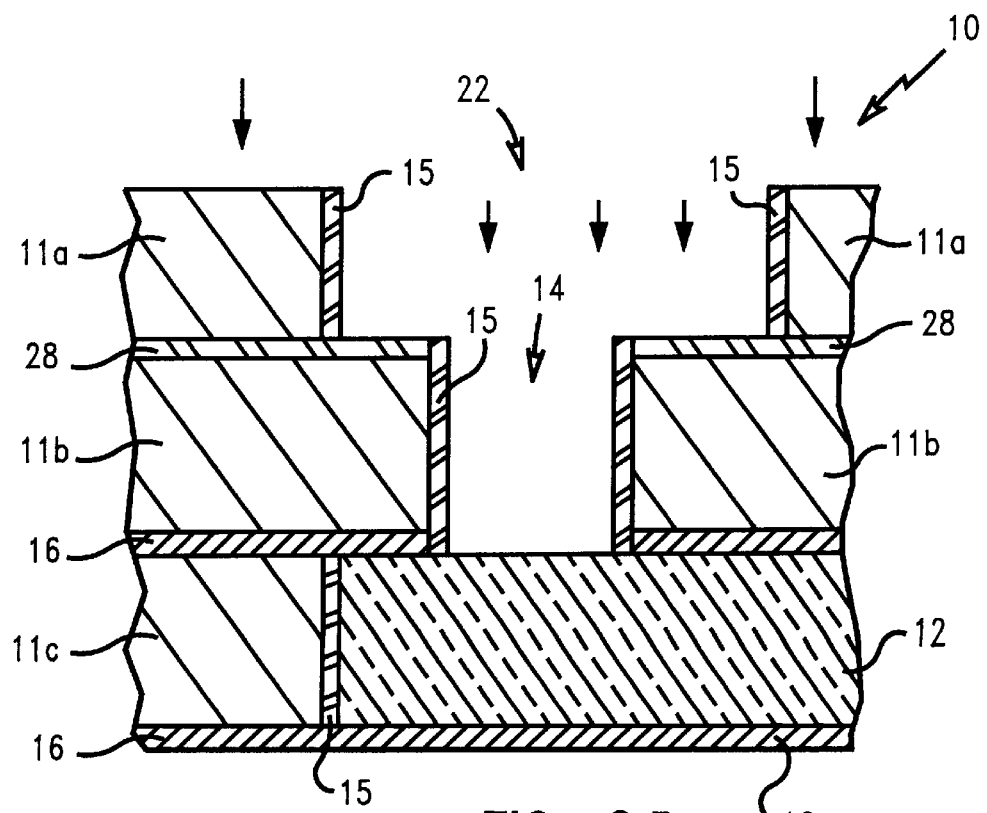

With regard to FIGS. 2A–2E, a sequence of steps is shown to make the interconnection stud of the invention in a multilayer electronic component 10 containing a dual Damascene line. In FIG. 2A, a typical dual Damascene line well known in the art is shown comprising insulator (dielectric) layers 11a, 11b and 11c shown having diffusion barrier layer 16 and 28 on the horizontal surfaces thereof. Diffusion barrier layer 28 also acts as etch stop when etching the opening in layer 11a for the Damascene line. A liner layer 15 is formed on all the exposed surfaces of the dual Damascene structure. A liner on horizontal surfaces has been designated as 15a. It is preferred that the liner material 15 be different from the horizontal diffusion barrier layers 16 and 28. It can be seen that the liner 15 also covers the upper surface of metallization 12 at the base of the via opening 14. In FIG. 2B, a directional etch as shown by the arrows is used to etch the horizontal liner 15a from the lower horizontal surface of via opening 14 and the horizontal surfaces of dielectric 11a and 11b stopping on etch stop layer 28. The directional etch is preferably a reactive ion etch using a gas such as chlorine which produces volatile etch products. The directional etch provides sidewall spacers 15 as is well-known in the art. It is necessary that the etchant stop on etch stop layer 28 so that this layer remains to provide a diffusion barrier.

Figure 2C:
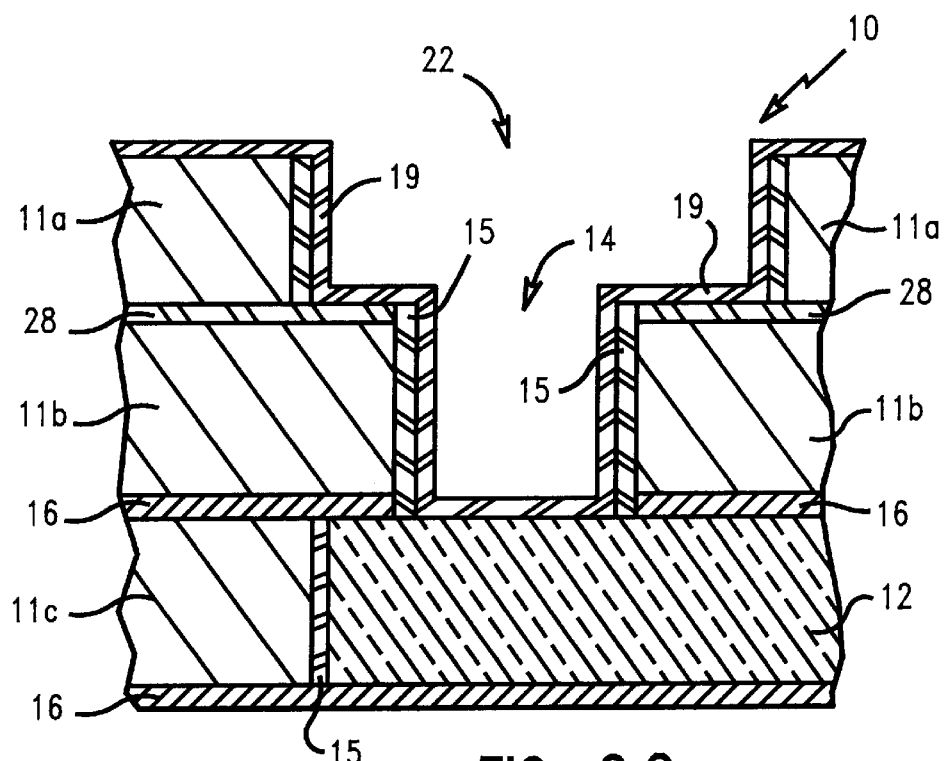
Figure 2D:
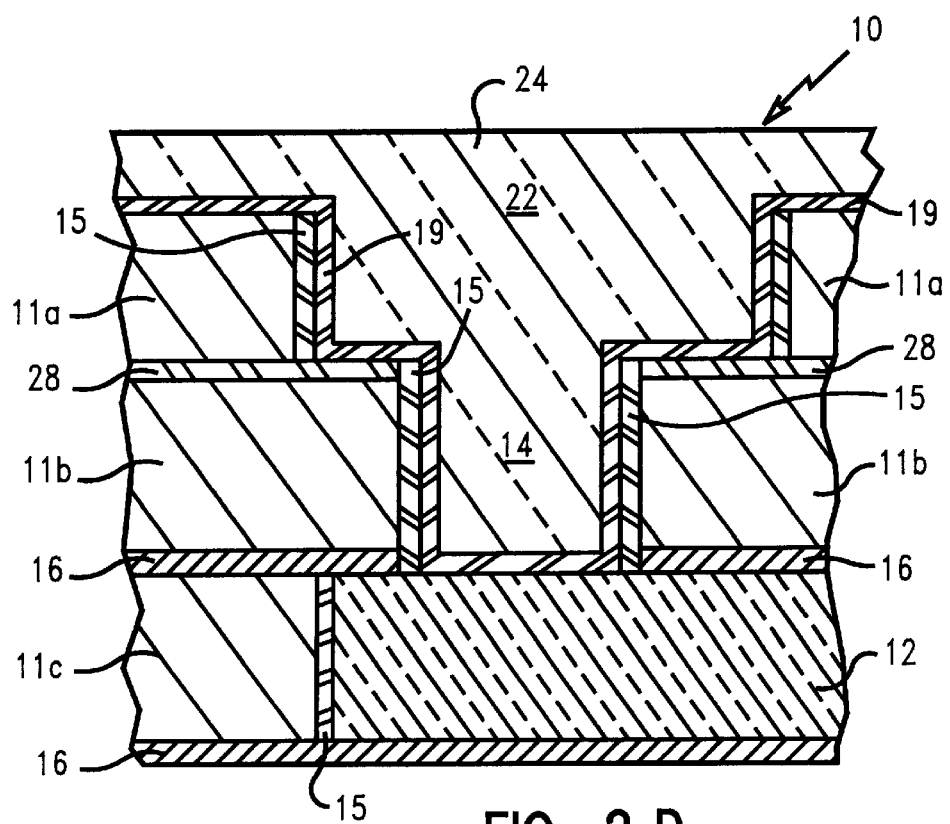
Figure 2:
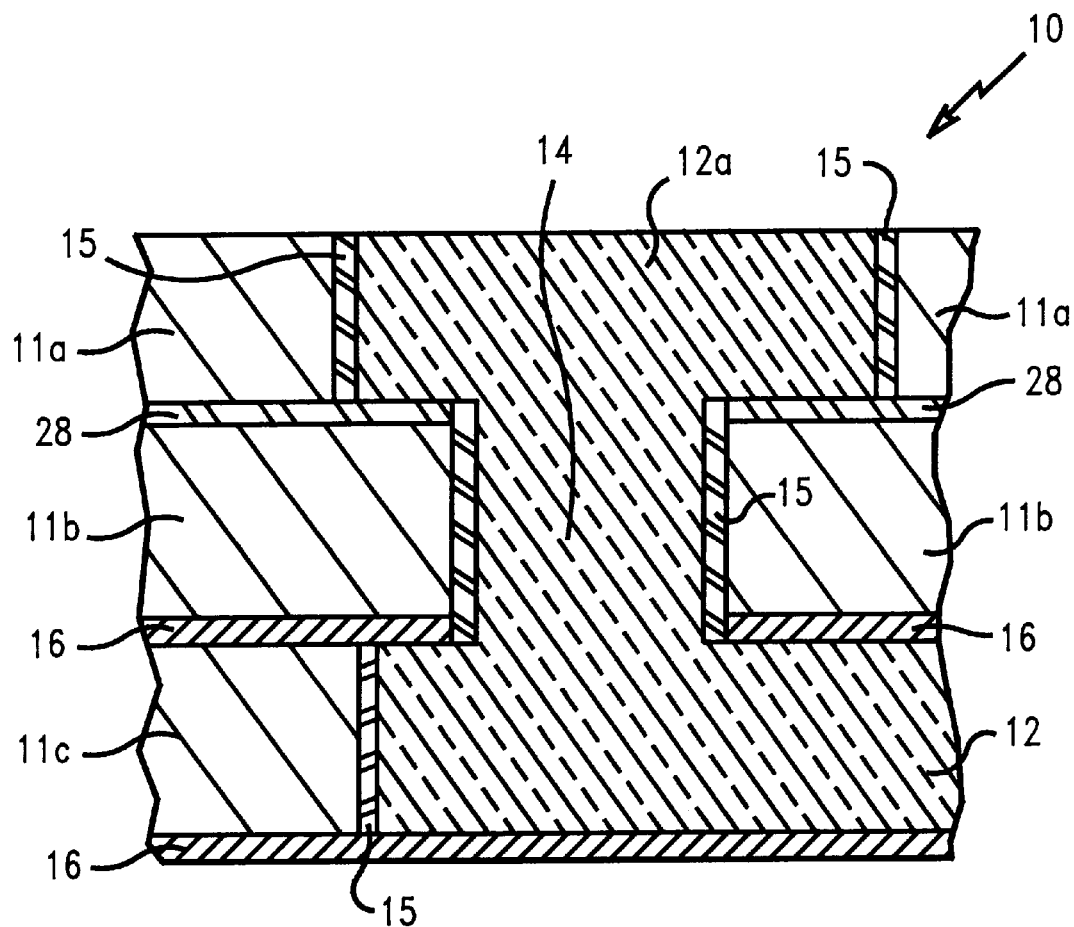

A copper seed layer 19 is then applied using known techniques such as flash plating, physical vapor deposition, chemical vapor deposition or electroless plating as shown in FIG. 2C and covers the dielectric 11a, barrier layer 28, via opening 14 sidewalls and the base of the via opening. A copper layer 24 is then electroplated as shown in FIG. 2D filling trench 22 and via 14. Copper layer 24 may also be deposited by chemical vapor deposition or physical vapor deposition. Alternatively, electroless plating can be used to form the metallization. In these cases a separate copper seed layer is generally not needed.

The copper layer 24 is then planarized to the surface of layer 11a forming the finished stud 14 and metallization 12a. For clarity metallization 12a and copper seed layer 19 are shown joined with the deposited copper 24 as metallization 12a and stud 14. There is no non-copper layer between metallization 12 and stud 14 or between metallization 12a and stud 14. Accordingly, connection of stud 14 with the two metallization layers avoids diffusion barriers therebetween, providing enhanced electromigration life.

Figure 3:
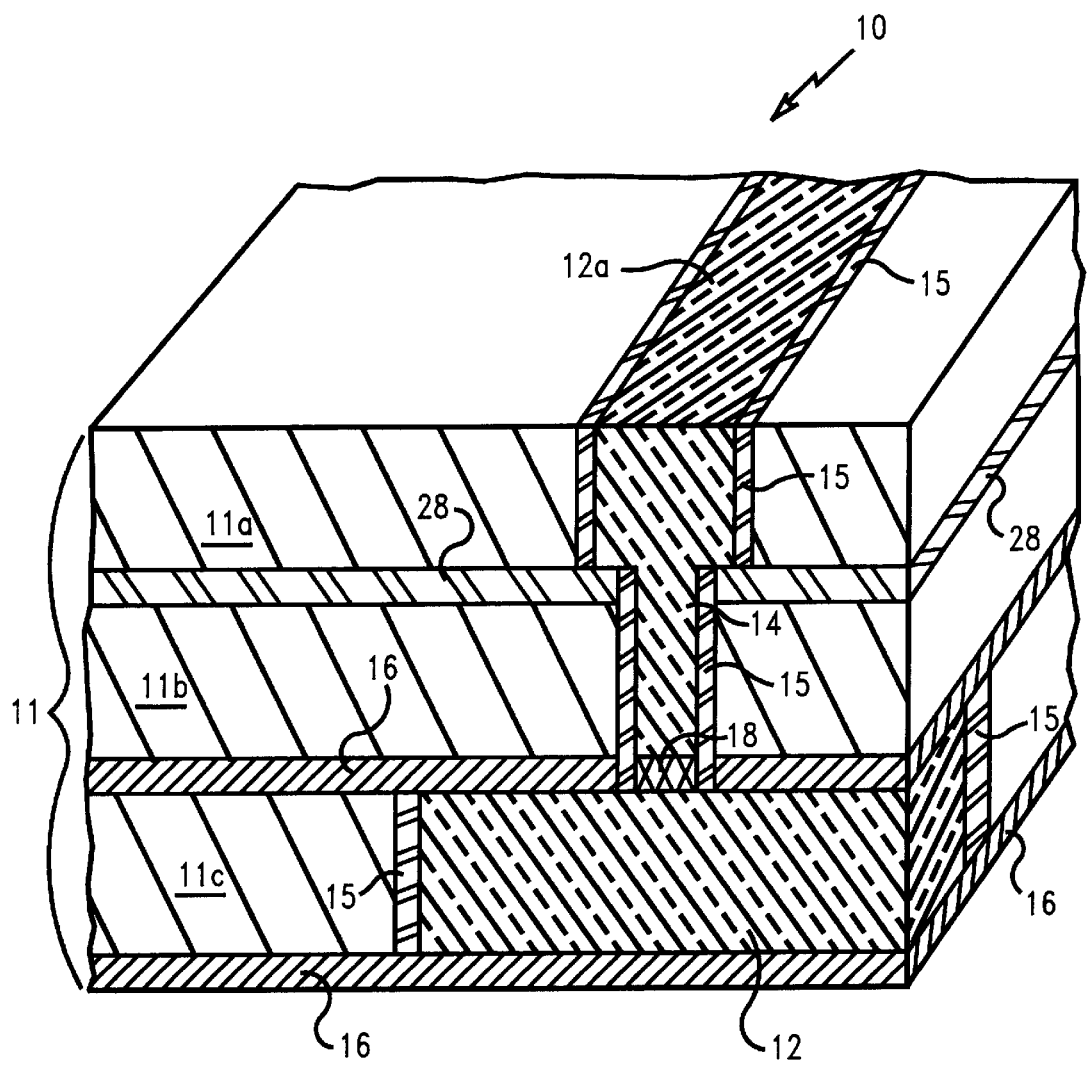
FIG. 3 shows a partial cross-sectional perspective view of an electronically interconnected multilayer electronic component of the invention having a discontinuous adhesion layer between the base of the interconnection stud and layer metallization.
Figure 4:
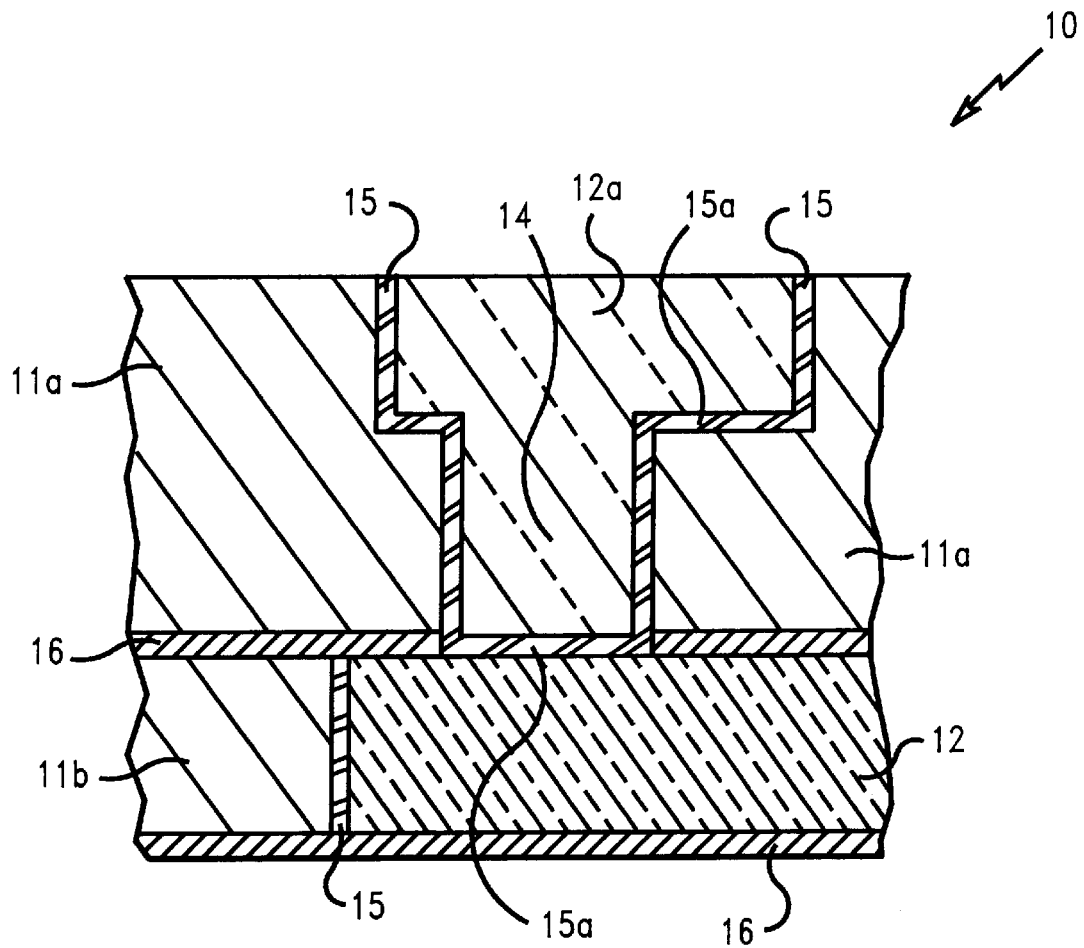
FIG. 4 shows a cross-sectional view of a prior art multilayer electronic component having a dual Damascene interconnecting stud with a diffusion barrier layer between the base of the stud and the upper surface of the metallization on the adjacent lower layer of the component.

An adhesion layer may be employed just prior to deposition of the copper seed layer 19 or just prior to the CU layer 24 if a copper seed layer is not used. In the plated component, copper will fill opening 14 together with the copper seed layer 19 if one is used (not shown in FIG. 3)and be separated from metallization 12 only by a discontinuous adhesion layer 18 (as shown in FIG. 3). The adhesion layer is not a barrier layer, and is typically a metal such as aluminum or chromium. The adhesion layer 18 has a thickness of about 0.5 to 20 nm, more preferably about 5 nm. It is highly preferred that the adhesion layer, if used, dissolve in the stud metal and/or metallization upon heating during fabrication of the component or during use of the component. Accordingly, in the final electronic component structure even if an adhesion layer 18 is used, the stud material 14 will be essentially directly connected (bonded) to metallization line 12.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A damascene or dual damascene interconnect structure in a multilayer electronic component for connecting metallization on one layer to a trench or via extending to said metallization the electronic component having an enhanced electromigration lifetime comprising:
   a first layer of dielectric having a first layer of conductor therein comprising a first material;
   a first diffusion barrier layer over said first layer of dielectric and first layer of conductor;
   a second dielectric layer over said first diffusion barrier layer;
   a trench or via through said second dielectric layer and first diffusion barrier layer extending to said first layer of conductor;
   a first liner along sidewalls of said trench or via for providing a diffusion barrier to said second dielectric layer; and
   a second layer of conductor comprising said first material filling said trench or via contacting said first layer of conductor, said first liner not being located between said first and second layers of conductor.

2. The interconnect of claim 1, wherein said first layer of conductor and second layer of conductor comprise copper.

3. The interconnect of claim 1, wherein said dielectric comprises one of a silicon oxide, a fluorinated oxide, a polymer, a diamond-like carbon, and a spun on glass.

4. The interconnect of claim 1, wherein an adhesion layer is between said first layer and said second layer of conductor.

5. The interconnect of claim 4, wherein said adhesion layer is not a diffusion barrier to copper.

6. The interconnect of claim 5, wherein said adhesion layer is discontinuous.

7. The interconnect of claim 6, wherein said adhesion layer is one of aluminum and chromium.

8. The interconnect of claim 1, wherein a horizontal layer is along an exposed horizontal surface in the trench, the horizontal layer formed of a second dielectric, the horizontal layer providing a diffusion barrier between said second conductor and said first dielectric, said horizontal layer formed of a material different than the first liner.

9. The interconnect of claim 8, wherein said horizontal layer is an etch stop to the first dielectric.

10. A damascene or dual damascene containing multilayer electronic component having an enhanced electromigration lifetime comprising:
    a plurality of dielectric layers having metallization therein and having diffusion barrier layers therebetween;
    openings in a form of a trench or via extending through at least one dielectric layer and diffusion barrier layer and connecting a first conductor at the lower surface of the trench or via;
    a first liner along sidewalls of said trench or via for providing a diffusion barrier to the dielectric laver; and
    a second conductor filling said trench or via contacting said first conductor, said first liner not being located between said first and second conductors.

11. The multilayer electronic component of claim 10 wherein the metallization and conductor are copper.

12. The multilayer electronic component of claim 11 which has a dual Damascene structure.

13. The multilayer electronic component of claim 10 wherein the dielectric is silicon oxide, a fluorinated oxide, a polymer, a diamond-like carbon or a spun on glass.

14. A multilayer electronic component of claim 10 wherein there is an adhesion layer between the metallization and the conductor.

15. The multilayer electronic component of claim 14 wherein the adhesion layer is not a diffusion barrier to copper.

16. The multilayer electronic component of claim 15 wherein the adhesion layer is discontinuous.

17. The multilayer electronic component of claim 14 wherein the adhesion layer is material that dissolves in the conductor or metallization during fabrication of the electronic component or during use of the electronic component.

18. The multilayer electronic component of claim 17 wherein the adhesion layer is aluminum, chromium.

19. The multilayer electronic component of claim 10 wherein a horizontal diffusion barrier layer is provided between the layers for providing a diffusion barrier between metallization on the surface thereof and the dielectric, said horizontal layer being formed of a material different than the liner material.

20. The multilayer electronic component of claim 19 wherein the horizontal layer is a etch stop to the dielectric.

* * * * *